United States Patent
Karunasiri et al.

(10) Patent No.: US 8,467,548 B2
(45) Date of Patent: Jun. 18, 2013

(54) MINIATURE MICRO-ELECTROMECHANICAL SYSTEM (MEMS) BASED DIRECTIONAL SOUND SENSOR

(75) Inventors: Gamani Karunasiri, Pacific Grove, CA (US); Jose Sinibaldi, Carmel, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 581 days.

(21) Appl. No.: 12/756,040

(22) Filed: Apr. 7, 2010

(65) Prior Publication Data

US 2011/0299701 A1 Dec. 8, 2011

Related U.S. Application Data

(60) Provisional application No. 61/167,466, filed on Apr. 7, 2009.

(51) Int. Cl.
*H04R 3/00* (2006.01)
*H04R 19/04* (2006.01)
*H04R 3/005* (2006.01)
*H04R 1/406* (2006.01)
*H04R 9/08* (2006.01)
*H04R 1/40* (2006.01)

(52) U.S. Cl.
CPC *H04R 3/00* (2013.01); *H04R 3/005* (2013.01); *H04R 19/04* (2013.01); *H04R 1/406* (2013.01); *H04R 9/08* (2013.01)
USPC ........... 381/111; 381/112; 381/113; 381/114; 381/115; 381/92

(58) Field of Classification Search
USPC .................................. 381/92, 122, 111–115
See application file for complete search history.

(56) References Cited

U.S. PATENT DOCUMENTS

| | | | | |
|---|---|---|---|---|
| 2003/0228025 A1* | 12/2003 | Hannah | ......................... | 381/113 |
| 2004/0057589 A1* | 3/2004 | Pedersen et al. | .............. | 381/152 |
| 2008/0101625 A1* | 5/2008 | Fazzio et al. | .................... | 381/92 |

OTHER PUBLICATIONS

Duckworth, G.L., Barger, J.E., Carlson, S.H., Gilbert, D.C., Knack, M.L., Korn, J., Mullen, R.J., "Fixed and Wearable Acoustic Countersniper Systems for Law Enforcement," SPIE Proceedings, vol. 3577(Nov. 3-5, 1998), Boston, MA.

McLeary, Paul, "Countersniper Tech Zeroes in on Shooters," Aviation Week [online], Mar. 16, 2009 [retrieved on May 7, 2010]. Retrieved from the Internet: <URL: http://www.aviationweek.com/aw/generic/story_channel.jsp?channel=defense&id=news/SNIPE031609.xml>.

* cited by examiner

*Primary Examiner* — Duc Nguyen
*Assistant Examiner* — George Monikang
(74) *Attorney, Agent, or Firm* — Lisa A. Norris

(57) ABSTRACT

A micro-electromechanical (MEMS) based directional sound sensor includes a two sensor wings attached to a surrounding support structure by two legs. The support structure is hollow beneath the sensor wings allowing the sensor wings to vibrate in response to sound excitation. In one embodiment, interdigitated comb finger capacitors attached on the sensor wing edges and the support structure enable an electrostatic (capacitive) readout related to the vibrations of the sensor which allows determination of the sound direction.

12 Claims, 8 Drawing Sheets

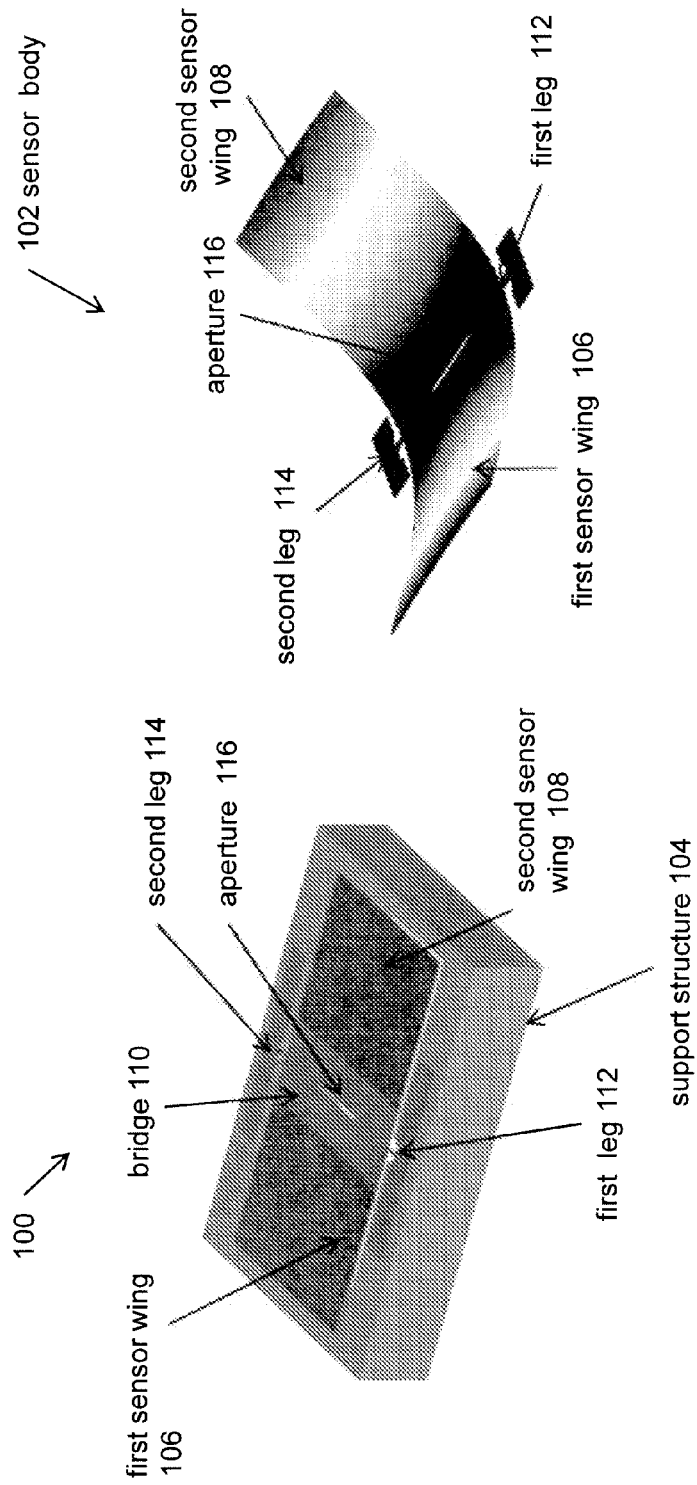

MINIATURE MICRO-ELECTROMECHANICAL SYSTEM (MEMS) BASED DIRECTIONAL SOUND SENSOR

CROSS-REFERENCE TO RELATED APPLICATIONS

This application claims the benefit of U.S. Provisional Application No. 61/167,466, filed Apr. 7, 2009, which is hereby incorporated in its entirety by reference.

BACKGROUND OF THE INVENTION

1. Field of the Invention

The present invention relates generally to sound sensors. More particularly, the invention relates to a directional sound sensor.

2. Description of the Related Art

Currently, accurate determination of the direction of sound arrival requires an array of spatially separated microphones monitoring the arrival times and amplitudes of different microphones. The accuracy of the directionality is determined by the extent of spatial separation of the microphones in the array making such a system relatively large and bulky.

SUMMARY OF THE INVENTION

Embodiments in accordance with the invention provide a miniature micro-electromechanical system (MEMS) based directional sound sensor for uniquely determining the direction of sound.

In accordance with one embodiment, a micro-electromechanical system (MEMS) based directional sound sensor includes: a sensor body, the sensor body further having a first sensor wing; a second sensor wing; a bridge coupling the first sensor wing and the second sensor wing; a first leg connected to the bridge; and a second leg connected to the bridge; and a support structure, the support structure connected to the sensor body at the first leg and the second leg, wherein the support structure is hollow beneath the sensor body, allowing the sensor body to vibrate upon sound excitation. In one embodiment, interdigitated comb finger capacitors located at the edges of the first and second sensor wings enable an electrostatic (capacitive) readout that allows determination of the incident sound direction. In one embodiment, the use of at least two MEMS based directional sounds sensors oriented at different angles allows determination of the direction of sound in more than one plane.

In accordance with another embodiment, a method for making a micro-electromechanical system (MEMS) based directional sound sensor includes: obtaining a silicon on insulator (SOI) substrate; forming a sensor body from the SOI substrate, the sensor body including: a first sensor wing; a second sensor wing; a bridge coupling the first sensor wing and the second sensor wing; a first leg connected to the bridge; and a second leg connected to the bridge; and forming a support structure from the SOI substrate, wherein the support structure is connected to the sensor body at the first leg and the second leg, and further wherein the support structure is hollow beneath the sensor body allowing the sensor body to vibrate in response to sound excitation. In one embodiment, the sensor body and support structure include electrically conductive paths for communicating information related to the sound excitation of the sensor body to an external device, such as a microprocessor, for determination of the direction of sound. In one embodiment, interdigitated comb finger capacitors enable electrostatic (capacitive) readout associated with sound excitation of the first sensor and second sensor wings that allows determination of the incident sound direction.

Embodiments in accordance with the invention are best understood by reference to the following detailed description when read in conjunction with the accompanying drawings.

BRIEF DESCRIPTION OF THE DRAWINGS

FIG. 1A illustrates a miniature MEMS based directional sound sensor in accordance with one embodiment.

FIG. 1B illustrates a simulated response with flexing of the two sensor wings of the MEMS based directional sound sensor to a sound wave with 1 Pa pressure incident at 45 degrees in accordance with one embodiment.

Figure 2A:
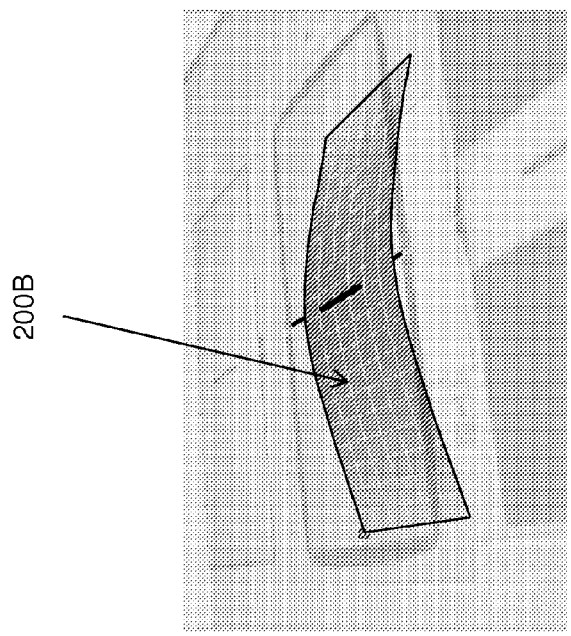
FIG. 2A illustrates a rocking mode in accordance with one embodiment.

Embodiments in accordance with the invention are further described herein with reference to the drawings.

DETAILED DESCRIPTION OF THE INVENTION

Directional sound sensing systems generally use an array of omnidirectional microphones to sense the time and pressure difference between multiple locations. Given the sound speed, the direction of the sound source in relation to the array can be determined. In this type of configuration, the accuracy of the calculated direction is largely dependent on the extent of separation between array nodes. This requirement for spatial separation poses a significant challenge for fabricating systems which are much smaller than the wavelengths of interest because the responses at all locations are essentially in-phase and practically no measurable difference is observed between nodes. However, the Ormia Ochracea fly achieves the directional sound sensing by using ears that are separated by a mere 500 µm.

The separation of the ears of the fly is too small for it to sense the direction of a sound source, if it uses the difference in arrival times and amplitudes of sound at each ear, as larger animals do. The Ormia Ochracea fly has remarkable sensitivity to direction of sound owing to its unique ear structure. The fly's ear structure has two rods hinged at the center; this helps to magnify the difference in amplitude as well as the phase of the sound wave.

Generally viewed, embodiments in accordance with the invention provide a miniature micro-electromechanical system (MEMS) based directional sound sensor for directional sensing of sound similar to that of the Ormia Ochracea fly. Referring now to FIGS. 1A and 1B together, in one embodiment, a miniature MEMS based directional sound sensor 100 includes a sensor body 102 attached to a surrounding support structure 104. In one embodiment, sensor body 102 includes: a first sensor wing 106 and a second sensor wing 108 connected by a bridge 110, and a first leg 112 and a second leg 114 extending centrally from opposite sides of sensor body 102 and attached to support structure 104. In one embodiment, the terminal ends of first leg 112 and second leg 114 are enlarged as shown in FIGS. 1A and 1B to provide secure attachment to support structure 104, e.g., bonding pads.

In one embodiment, support structure 104 is hollow underneath sensor body 104 to allow sensor wings 106 and 108 to oscillate under sound excitation with air damping. In one embodiment, comb finger capacitors located at the edges of first sensor wing 106 and second sensor wing 108 enable electrostatic (capacitive) readout associated with movement of first sensor wing 106 and second sensor wing 108. One embodiment of a miniature MEMS based directional sound sensor including comb finger capacitors is further described herein with reference to FIG. 6.

Under sound excitation, first sensor wing 106 and second sensor wing 108 exhibit two fundamental modes of vibration, rocking and bending, which are strongly dependent on the direction of incident sound. The coupling of the rocking and bending motions of sensor wings 106, 108 plays an important role in determining the direction of sound. The dimensions of legs 112, 114 determine the rocking frequency ($\omega_r$) of MEMS based directional sound sensor 100, while the thickness of sensor wings 106, 108 determine the bending frequency ($\omega_b$). In one embodiment, an aperture 116, i.e., a slit, centrally located in bridge 110 is present which also determines the bending frequency ($\omega_b$).

FIG. 1B shows flexing of sensor wings 106, 108 to a sound wave with 1 Pa pressure incident at 45 degrees in accordance with one embodiment. When the sound incident is normal to the surface of MEMS based directional sound sensor 100, the bending motion of sensor wings 106, 108 can be excited due to the symmetry of the sensor structure. Thus, sensor wings 106, 108 will not oscillate if the sound frequency is the same as the rocking frequency of sensor wings 106, 108. However, when the sound incident is at an angle, both rocking and bending modes can be excited.

Figure 2B:
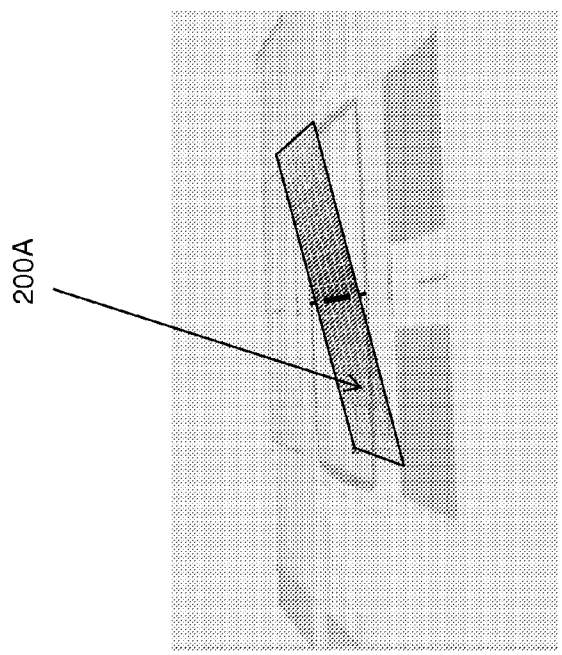
FIG. 2B illustrates a bending mode in accordance with one embodiment.

FIG. 2A illustrates a rocking mode in accordance with one embodiment. FIG. 2B illustrates a bending mode in accordance with one embodiment. The rocking mode is driven by a differential pressure between the two sensor wings 106, 108, while the bending mode drives both sides with the full sound pressure incident on miniature MEMS based directional sound sensor 100, causing much larger amplitudes in the bending mode motion.

When the sound wave hits the top surface of sensor 100 it is diffracted and reaches the bottom side with a time delay corresponding to an effective path length, L. Thus, the net sound pressure at the sensor can be written as a linear combination of the incident and diffracted components:

$$P = P_0(1 - e^{jkL \cos \theta})$$

where k is the wave number and $P_0$ is the amplitude of the incident sound wave. Since the wavelength of the incident sound is much longer than the sensor dimensions, i.e., $kL \ll 1$, it can be easily seen from the above equation that the net pressure is proportional to $\cos \theta$.

As mentioned earlier, the amplitude of the bending motion is proportional to the net sound pressure at MEMS based directional sound sensor 100, so its directional response has a cosine dependence. In order to determine the direction of an unknown sound source, the amplitude of the sound pressure is needed which can be conveniently determined using an omnidirectional MEMS microphone or using two sensors 100 mounted at an angle.

Figures 3A, 3B:
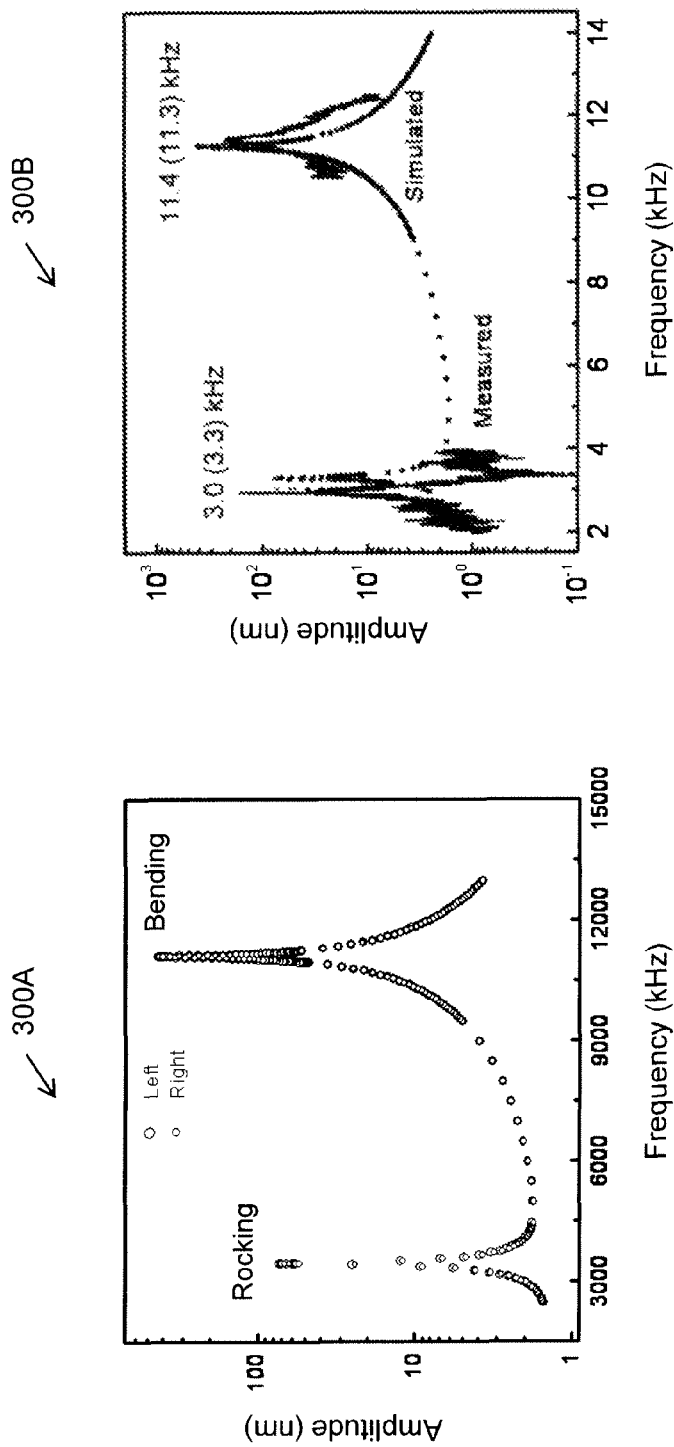
FIG. 3A illustrates how the rocking and bending amplitudes vary as a function of frequency for sound incident at 45 degrees in accordance with one embodiment.
FIG. 3B illustrates a comparison of the simulated and measured responses in accordance with one embodiment.

FIG. 3A illustrates a simulated frequency response of how the rocking and bending amplitudes vary as a function of frequency for sound incident at 45 degrees to the surface of sensor wings 106, 108 in accordance with one embodiment. FIG. 3B illustrates a comparison of simulated and measured responses in accordance with one embodiment. It can be seen in FIG. 3A that the rocking and bending amplitudes are nearly the same for all the frequencies since the two modes are relatively far apart and hence the coupling between them are weak. Thus, the measured frequency response of MEMS based directional sound sensor 100 is in close agreement with the simulation.

Figure 4B:
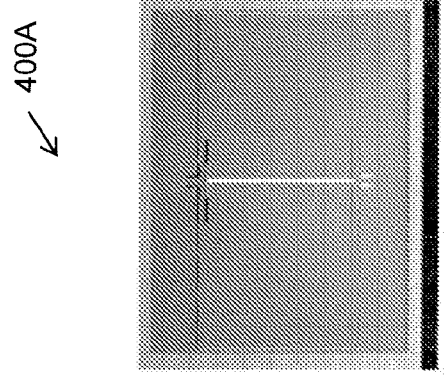
FIGS. 4A and 4B illustrate different aperture formations in accordance with other embodiments.
Figure 4A:
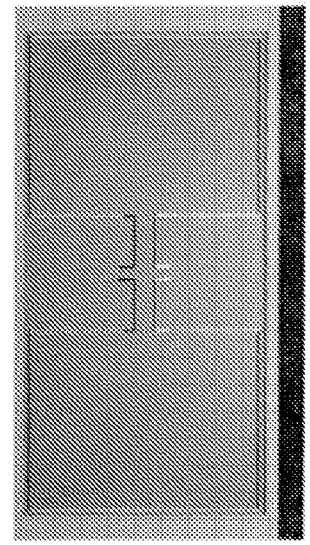

In one embodiment, aperture 116 is centrally formed in bridge 110 to bring the bending frequency closer to the rocking frequency. In some embodiments, MEMS based directional sound sensor can be formed with differently shaped apertures 116 as illustrated in FIGS. 4A and 4B or with no aperture 116 (not shown).

In some embodiments, the surface of sensor wings 106, 108 can be textured to produce textured sensor wings. In one embodiment, the textured sensor wings can be formed by etching an array of holes that alter the width of the resonance peaks and hence the degree of coupling between the two modes, i.e., rocking and bending. The larger the peak width, the faster the response of the MEMS based directional sound sensor 100 to sound.

In one embodiment, the amplitudes of oscillation of the two sensor wings can be used for determining the direction sound arrives at the sensor with an unknown frequency spectrum and pressure. The simulated frequency response of the sensor in FIG. 3B shows narrow frequency bands with high amplitude at both rocking and bending modes. The narrow band nature of the frequency response at the rocking mode can be used to eliminate one of the unknowns, i.e., the frequency at which the amplitudes are measured. The calculated amplitudes ($A_1$, $A_2$) of the two sensor wings 106, 108 as a function of sound frequency ($\omega$) are given by:

$$A_1^2 = A_b^2 + A_r^2 + 2A_b A_r \sin(\phi_b - \phi_r)$$

$$\tan(\phi_r) = -\frac{\gamma_r \omega}{(\omega_r^2 - \omega^2)}$$

$$A_r \approx \frac{P_0 s}{m} \left( \frac{\omega d}{2v_s} \right) \left( \frac{\sin\theta \cos\theta}{\sqrt{(\omega_r^2 - \omega^2)^2 + (\gamma_r \omega)^2}} \right)$$

$$A_2^2 = A_b^2 + A_r^2 - 2A_b A_r \sin(\phi_b - \phi_r)$$

$$\tan(\phi_b) = -\frac{\gamma_b \omega}{(\omega_b^2 - \omega^2)}$$

$$A_b \approx \frac{P_0 s}{m} \left( \frac{\cos\theta}{\sqrt{(\omega_b^2 - \omega^2)^2 + (\gamma_b \omega)^2}} \right)$$

where $\gamma_r$ is the air damping coefficient at the rocking frequency, $\gamma_b$ is the air damping coefficient at the bending frequency, θ is the direction of sound incident measured from the normal to the surface of the sensor wings 106, 108, m is the mass of each sensor wing 106,108, s is the surface area of each sensor wing 106,108, P is the amplitude of sound pressure at the MEMS based directional sound sensor 100, $v_s$ is the velocity of sound, $\omega_r$ is the rocking frequency, and $\omega_b$ is the bending frequency.

Since the air damping is relatively small (i.e., $\gamma_r$ and $\gamma_b$ are small compared to $\omega_r$ and $\omega_b$), it can be shown using the above equations that ratio of sum and the difference of the two amplitudes at rocking frequency is given by $$\frac{A_1 + A_2}{A_1 - A_2} = \frac{(\omega_b^2 - \omega_r^2)}{\gamma_r} \frac{d}{2v_s} \sin(\theta)$$

Figures 5A, 5B:
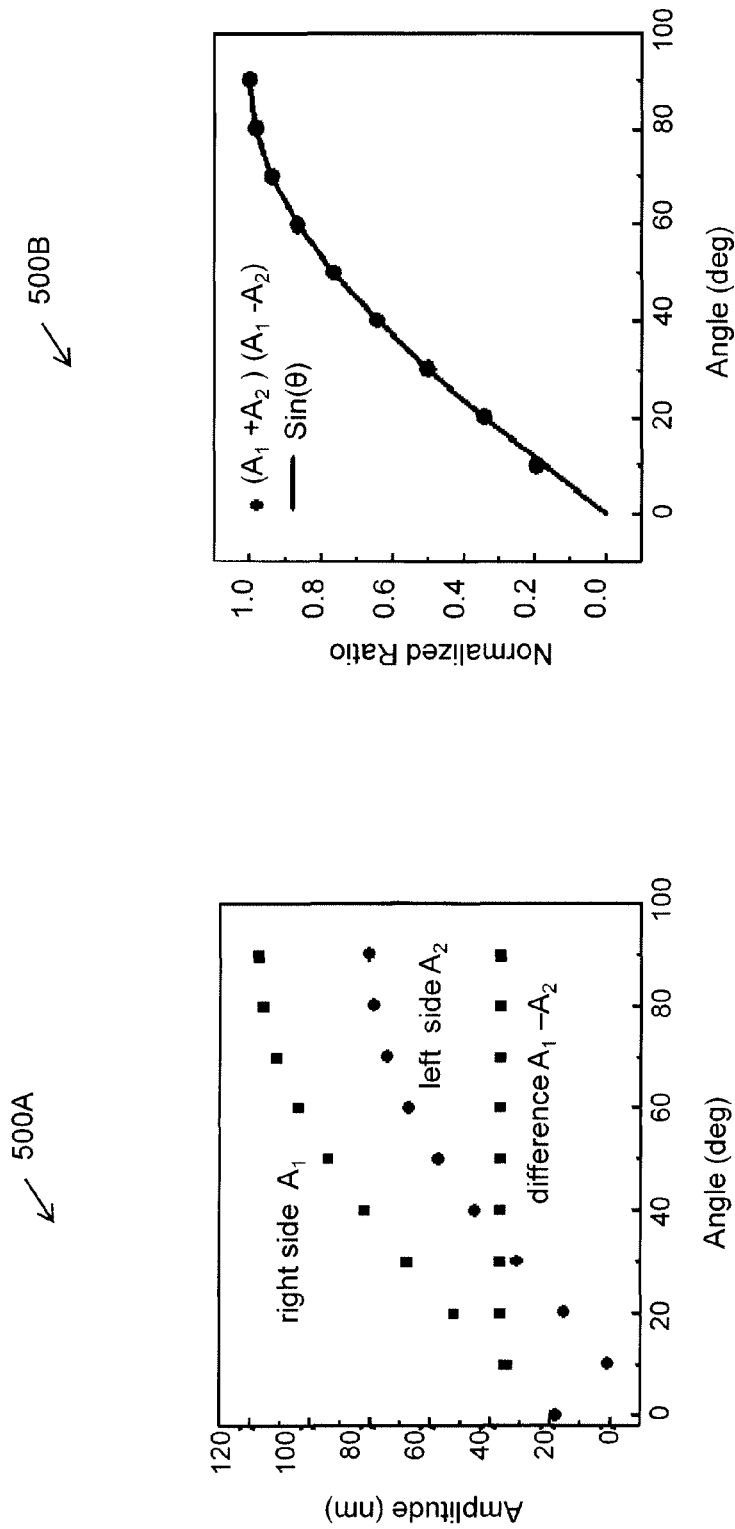
FIG. 5A illustrates directional dependence of right and left sensor wing amplitudes in accordance with one embodiment.
FIG. 5B illustrates a plot of ratio of sum and difference of the rocking and bending amplitudes and sine as a function of direction of sound in accordance with one embodiment.

Note that the sound pressure, $P_o$, is not present in the above equation and the only unknown is the angle of incident. MEMS based directional sound sensor 100 shows response as a function of the incident angle of sound, which indicates a relatively large separation of right sensor wing and left sensor wing amplitudes at the rocking frequency as well as strong dependence with the incident angle. Further, the difference between the amplitudes remains nearly a constant with the incident angle, θ, of sound. In addition, the ratio between sum and difference of the two amplitudes is found to be proportional to the sine of the angle as illustrated in FIGS. 5A and 5B. This provides a unique way to determine the direction of sound as long as the incident sound signal contains the rocking frequency.

FIG. 5A illustrates directional dependence of right and left sensor wing amplitudes in accordance with one embodiment. FIG. 5B illustrates a plot of ratio of sum and difference of the amplitudes and sine as a function of direction of sound in accordance with one embodiment.

In one embodiment, for measuring the amplitudes of vibrations using electronics means, micro-electronic comb capacitors are incorporated at the edges of sensor wings 106, 108 where a plurality of comb fingers are located at the edges of sensor wings 106, 108 and interdigitate (at rest) with corresponding comb fingers located on support structure 104. Micro-electronic comb capacitors include comb fingers that are interdigitated so that a portion of the comb fingers are typically on one structure and a corresponding portion of the comb fingers are located on another structure.

Micro-electronic comb capacitors are well known in the art. However, while almost all MEMs devices utilizing comb finger capacitors for sensing employ in-plane transverse and longitudinal motion, embodiments in accordance with the invention, instead measure the changing capacitance as the comb fingers move vertically in and out of the support structure 104 plane. A strong electrical signal is obtained when MEMS based directional sound sensor 100 is excited using a sound source due to change in capacitances at the combs. For example, in one embodiment, the measurement of capacitance can be carried out using an Irvine Sensors' MS3110BDPC capacitive readout electronic board (available from Irvine Sensors Corporation, Costa Mesa, Calif.). For readout of individual comb displacements using this approach, two more fixed reference capacitors can be added to MEMS based directional sound sensor 100 which will allow the differential measurement of the changing capacitances due to response to sound.

Figure 6:
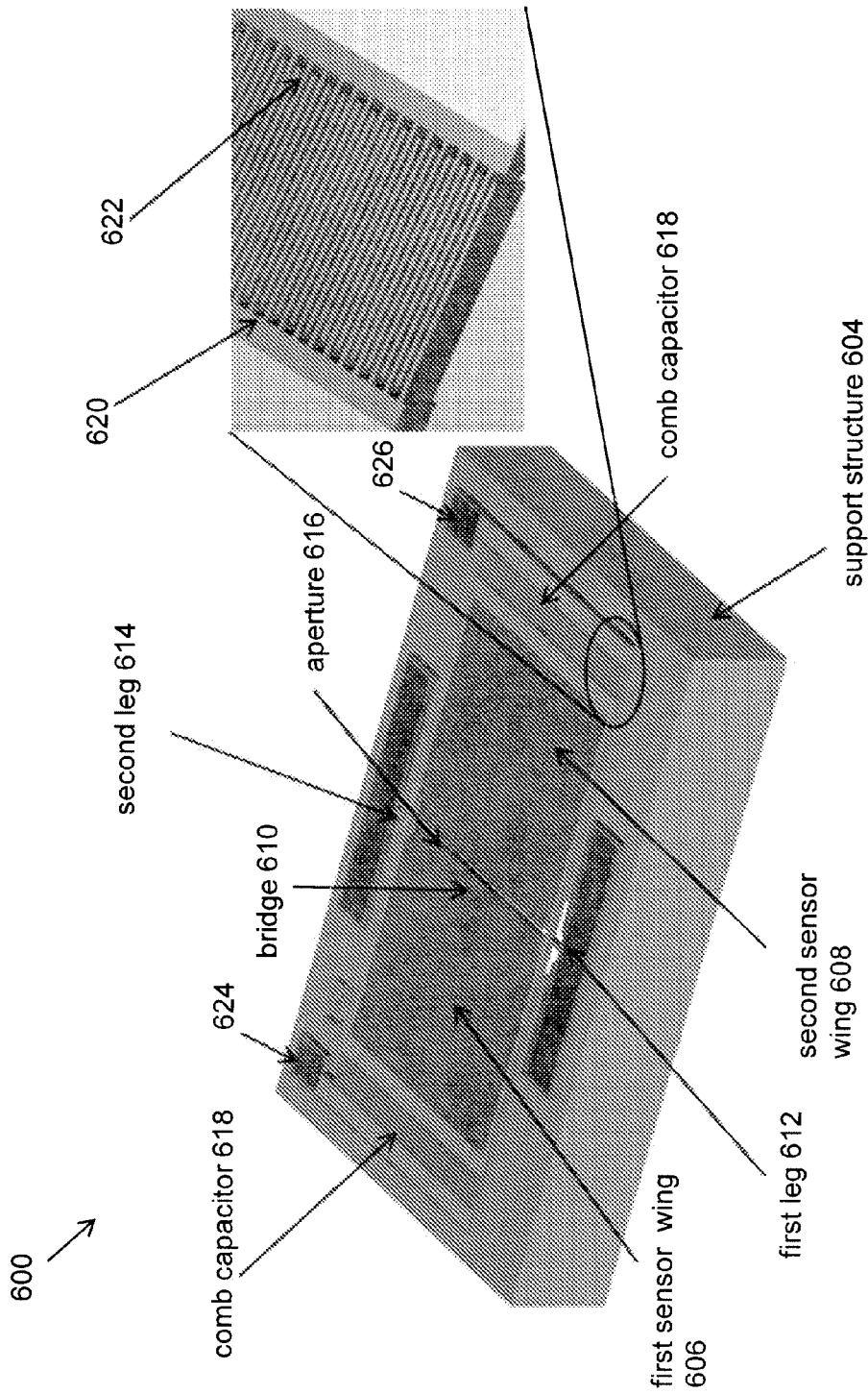
FIG. 6 illustrates a miniature MEMS based directional sound sensor including comb capacitors in accordance with one embodiment.

FIG. 6 illustrates a MEMS based directional sound sensor including comb finger capacitors for electronic capacitive readout in accordance with one embodiment. Referring now to FIG. 6, in one embodiment, a miniature MEMS based directional sound sensor 600 includes a sensor body 602 attached to a surrounding support structure 604. In one embodiment, sensor body 602 includes: a first sensor wing 606 and a second sensor wing 608 connected by a bridge 610, and a first leg 612 and a second leg 614 extending centrally from opposite sides of sensor body 602 and attached to support structure 604. In one embodiment, the terminal ends of first leg 612 and second leg 614 are enlarged as shown in FIG. 6 to provide secure attachment to support structure 604, e.g., bonding pads.

In one embodiment, support structure 604 is hollow underneath sensor body 604 to allow sensor wings 606 and 608 to oscillate under sound excitation with air damping. In one embodiment, MEMS based directional sound sensor 600 includes two comb finger capacitors 618, i.e., a first comb finger capacitor and a second comb finger capacitor. In one embodiment, comb finger capacitors 618 are located on the edge of first sensor wing 606 and second sensor wing 608 such that a portion of comb fingers on sensor wings 606,608 interdigitate with corresponding comb fingers on support structure 604 to enable electrostatic (capacitive) readout associated with movement of first sensor wing 606 and second sensor wing 608.

As illustrated in the enlargement of a portion of comb capacitor 618, at rest, comb fingers 620 located at the edge of sensor wing 608 are interdigitated with corresponding comb fingers 622 of comb capacitor 618 on support structure 604. It can be understood that a similar arrangement is present at the edge of first sensor wing 606 and support structure 604. Comb finger capacitors 618 measure the changing capacitance as the comb fingers, for example, comb fingers 620, move vertically in and out of the support structure 604 plane. In one embodiment, bonding pads 624, 626 are utilized to allow capacitive readouts from comb capacitors 618 to be transferred to a device, such as a microprocessor, to allow determination of the incident sound direction from sensor 600 when under sound excitation.

Figure 7:
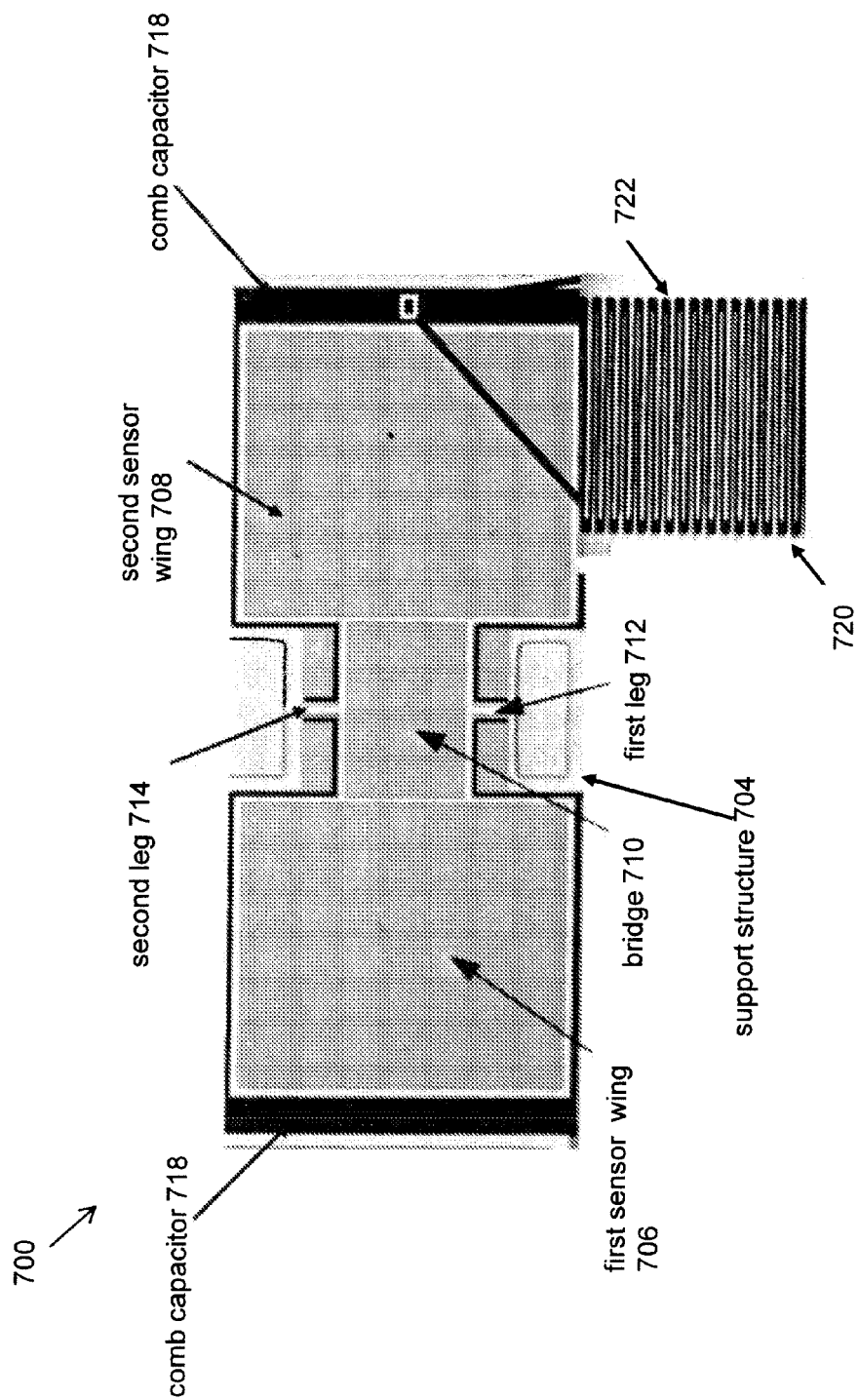
FIG. 7 illustrates a miniature MEMS based directional sound sensor including comb capacitors in accordance with another embodiment.

FIG. 7 illustrates a top view of a miniature MEMS based directional sound sensor 700 including comb capacitors in accordance with another embodiment. Referring now to FIG. 7, in one embodiment, miniature MEMS based directional sound sensor 700 includes a sensor body 702 attached to a surrounding support structure 704. In one embodiment, sensor body 702 includes: a first sensor wing 706 and a second sensor wing 708 connected by a bridge 710, and a first leg 712 and a second leg 714 extending centrally from opposite sides of sensor body 702 and attached to support structure 704. In one embodiment, the terminal ends of first leg 712 and second leg 714 are enlarged as shown in FIG. 7 to provide secure attachment to support structure 704, e.g., bonding pads.

In one embodiment, support structure 704 is hollow underneath sensor body 704 to allow sensor wings 706 and 708 to oscillate under sound excitation with air damping. In one embodiment, MEMS based directional sound sensor 700 includes two comb finger capacitors 718, i.e., a first comb finger capacitor and a second comb finger capacitor. In one embodiment, comb finger capacitors 718 are located on the edge of first sensor wing 706 and second sensor wing 708 such that a portion of comb fingers on sensor wings 706,708 interdigitate with corresponding comb fingers on support structure 704 to enable electrostatic (capacitive) readout associated with movement of first sensor wing 706 and second sensor wing 708.

As illustrated in the enlargement of a portion of comb capacitor 718, at rest, comb fingers 720 located at the edge of sensor wing 708 are interdigitated with corresponding comb fingers 722 of comb capacitor 718 on support structure 704. It can be understood that a similar arrangement is present at the edge of first sensor wing 706 and support structure 704. Comb finger capacitors 718 measure the changing capacitance as the comb fingers, for example, comb fingers 720, move vertically in and out of the support structure 704 plane. In one embodiment, bonding pads (not shown) are utilized to allow capacitive readouts from comb capacitors 718 to be transferred to a device, such as a microprocessor, to allow determination of the incident sound direction from sensor 700 when under sound excitation.

Figure 8:
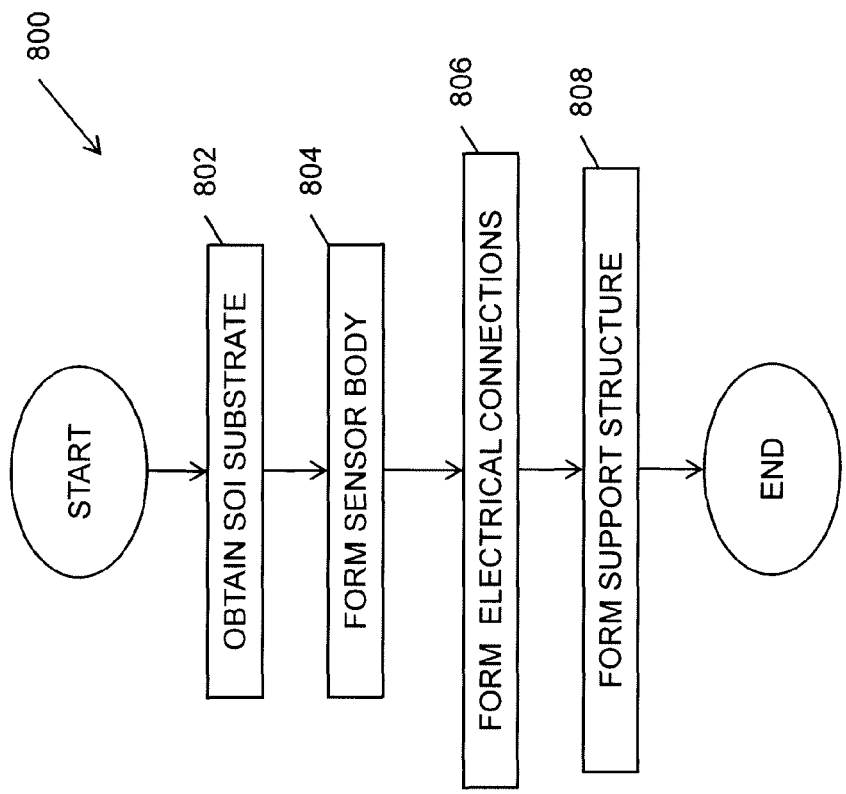
FIG. 8 illustrates a method for fabricating a miniature MEMS based directional sound sensor in accordance with one embodiment.

FIG. 8 illustrates a method 800 for fabricating a miniature MEMS based directional sound sensor in accordance with one embodiment.

Referring now to FIG. 8, in accordance with one embodiment, a method 700 for fabricating a MEMS based directional sound sensor such as MEMS based directional sound sensor 700 is described. In one embodiment, MEMS based directional sound sensor 700 is fabricated on a silicon on insulator (SOI) substrate with comb finger capacitors to electronically readout MEMS based directional sound sensor 700 (e.g., sensor wings) response to sound excitation. The use of an SOI substrate provides a simplified fabrication process with potential to create a single monolithic sensor that includes both the transducer and processing electronics. In one embodiment, the MEMS based directional sound sensor 700 is fabricated via the silicon-on-insulator multi-user MEMs process (SOI MUMPs).

In one embodiment, method 800 is entered at an OBTAIN SOI SUBSTRATE operation 802, in which a silicon on insulator substrate is obtained. For example, in one embodiment, MEMS based directional sound sensor 700 is fabricated using a SOI substrate with a 10 (±)μm n-type Si device layer on a 400 μm substrate, separated by a 1 μm SiO2 layer. From operation 802, processing transitions to a FORM SENSOR BODY operation 804.

In FORM SENSOR BODY operation 804, in one embodiment, sensor body 702 is formed in the device layer. In one embodiment, sensor body 702 includes first sensor wing 706 and second sensor wings 708 joined by a bridge 710 as illustrated in FIG. 7.

In one embodiment, sensor body 702 further includes first leg 712 and second leg 714. In one embodiment, each leg 712, 714, is about 50 μm wide and about 100 μm long. In one embodiment, comb finger capacitors 718 are formed at the edges of sensor wings 706,708 as earlier described. In one embodiment, comb finger capacitors 718 are 100 μm long and 2 μm wide with a 2 μm air gap between the comb fingers. In one embodiment, 125 comb fingers are used on each correspondent side of comb capacitor 718, producing a total capacitance of about 1 pF. Again, while almost all MEMs devices utilizing comb finger capacitors for sensing employ in-plane transverse and longitudinal motion, embodiments in accordance with the invention, instead measure the changing capacitance as the comb fingers move vertically in and out of the support structure 704 plane. From operation 804, processing transitions to a FORM ELECTRICAL CONNECTIONS operation 806.

In FORM ELECTRICAL CONNECTIONS operation 806, electrical connections are formed on sensor body 702 and structural support 704. In one embodiment, electrical contacts 724, 726 to the comb finger capacitors 618 are created by selectively depositing 20 nm chrome followed by 500 nm gold. Sensor wings 706, 708, which are electrically connected, are used as the ground, and the two electrically isolated fixed comb finger capacitors 718 are used for measuring the changing capacitances under sound excitation. In one embodiment, bonding pads of comb finger capacitors 718 are wire bonded to support structure 704. From operation 806, processing transitions to a FORM STRUCTURAL SUPPORT operation 808.

In FORM STRUCTURAL SUPPORT operation 808, structural support 704 is formed. In one embodiment, the portion of support structure 704 underlying sensor wings 706, 708 and legs 712, 714 (excepting the leg attachment points on substrate 704) is removed to prevent squeezed-film damping between sensor wings 706, 708 and support structure 704. In one embodiment, this is accomplished by hollowing the underside of the SOI wafer beneath sensor body 702. In some embodiments, further shaping of structural support 704 is accomplished to a specified final shape of miniature MEMS based directional sound sensor 700. From operation 808, processing exits method 800. Those of skill in the art can recognize that the operations of method 800 are not limiting to the order presented herein and that the various operations can be rearranged and/or combined.

Accordingly, this disclosure provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

What is claimed is:

1. A micro-electromechanical system (MEMS) based directional sound sensor comprising:
   a single piece sensor body, the sensor body comprising:
      a first sensor wing,
      a second sensor wing,
      a bridge coupling said first sensor wing with said second sensor wing,
      a first leg connected to said bridge, and
      a second leg connected to said bridge; and
   a support structure, said support structure connected to said sensor body, wherein said support structure is hollow beneath said sensor body, allowing said sensor body to vibrate upon sound excitation;
   wherein said sensor body further comprises:
      a plurality of sensor comb finger capacitors; and
   further wherein said support structure further comprises:
      a corresponding plurality of support structure comb finger capacitors, wherein said plurality of sensor comb finger capacitors moveably interdigitate with said corresponding plurality of support structure comb finger capacitors.

2. The MEMS based directional sound sensor of claim 1 wherein said support structure is connected to said sensor body at said first leg and said second leg.

3. The MEMS based directional sound sensor of claim 1 wherein said bridge further comprises:
   an aperture located in said bridge.

4. The MEMS based directional sound sensor of claim 3, wherein said aperture is centrally located in said bridge.

5. The MEMS based directional sound sensor of claim 1 further comprising:
   one or more electrically conductive paths, said one or more electrically conductive paths for communicating vibration information about said sensor body to a receiving device.

6. The MEMS based directional sound sensor of claim 5, wherein said receiving device is a microprocessor unit, said microprocessor unit for determining a direction of sound based upon said vibration information.

7. The MEMS based directional sound sensor of claim 1 wherein a portion of said plurality of sensor comb finger capacitors are located on said first sensor wing and another portion of said plurality of sensor comb finger capacitors are located on said second sensor wing.

8. A directional sound sensor device comprising:
   a first MEMS based directional sound sensor, said first MEMS based directional sound sensor comprising:
      a single piece sensor body, the sensor body comprising:
         a first sensor wing,
         a second sensor wing,
         a bridge coupling said first sensor wing with said second sensor wing,
         a first leg connected to said bridge, and
         a second leg connected to said bridge; and
      a support structure, said support structure connected to said sensor body, wherein said support structure is hollow beneath said sensor body, allowing said sensor body to vibrate upon sound excitation;
      wherein said sensor body further comprises:
         a plurality of sensor comb finger capacitors; and
      further wherein said support structure further comprises:
         a corresponding plurality of support structure comb finger capacitors, wherein said plurality of sensor comb finger capacitors moveably interdigitate with said corresponding plurality of support structure comb finger capacitors;
   a second MEMS based directional sound sensor, said second MEMS based directional sound sensor comprising:
      a single piece sensor body, the sensor body comprising:
         a first sensor wing,
         a second sensor wing,
         a bridge coupling said first sensor wing with said second sensor wing,
         a first leg connected to said bridge, and
         a second leg connected to said bridge; and
      a support structure, said support structure connected to said sensor body, wherein said support structure is hollow beneath said sensor body, allowing said sensor body to vibrate upon sound excitation;
      wherein said sensor body further comprises:
         a plurality of sensor comb finger capacitors; and
      further wherein said support structure further comprises:
         a corresponding plurality of support structure comb finger capacitors, wherein said plurality of sensor comb finger capacitors moveably interdigitate with said corresponding plurality of support structure comb finger capacitors; and
   one or more electrically conductive paths from each of said first MEMS based directional sound sensor and said second MEMS based directional sound sensor, said one or more electrically conductive paths for communicating vibration information from said first MEMS based directional sound sensor and from said second MEMS based directional sound sensor to receiving device for determining a direction of sound based upon said vibration information.

9. The directional sound sensor device of claim 8 wherein said first and second MEMS based directional sound sensors are oriented to detect sound excitations in at least two different sound plane orientations.

10. A method for forming a micro-electromechanical system (MEMS) based directional sound sensor comprising:
   obtaining a silicon on insulator (SOI) support structure;
   forming a single piece sensor body from said SOI substrate, said sensor body comprising:
      a first sensor wing having a portion of a plurality of sensor comb finger capacitors,
      a second sensor wing having another portion of said plurality of sensor comb finger capacitors,
      a bridge coupling said first sensor wing with said second sensor wing,
      a first leg connected to said bridge, and
      a second leg connected to said bridge,
   forming a support structure from said SOI substrate, wherein said support structure is connected to said sensor body at said first leg and said second leg, and further wherein said support structure is hollow beneath said sensor body allowing said sensor body to vibrate in response to sound excitation, and further wherein said support structure has a corresponding plurality of support structure comb finger capacitors, wherein said plurality of sensor comb finger capacitors moveably interdigitate with said corresponding plurality of support structure comb finger capacitors; and
   forming electrically conductive paths on said sensor body and said support structure.

11. The method of claim 10 wherein said bridge includes an aperture.

12. The method of claim 10 wherein said SOI substrate comprises:
   an n-type Si top layer;
   a $SiO_2$ separation layer;
   and a bottom insulation layer.

* * * * *